United States Patent [19]

Hsieh et al.

[11] Patent Number: 5,738,970
[45] Date of Patent: Apr. 14, 1998

[54] NEGATIVE WORKING, PEEL DEVELOPABLE, SINGLE SHEET COLOR PROOFING SYSTEM WITH POLYVINYL ACETAL PHOTOADHERING LAYER

[75] Inventors: Shane Hsieh, Bridgewater; Rusty Koenigkramer, Neshanic Station; Shuchen Liu, Annandale; Richard Shadrach, Belle Mead, all of N.J.; David Siegfried, Langhorne, Pa.; Wojciech Wilczak, Jersey City, N.J.

[73] Assignee: Bayer Corporation, Pittsburgh, Pa.

[21] Appl. No.: 823,766

[22] Filed: Mar. 24, 1997

[51] Int. Cl.$^6$ ............................................. G03C 11/12
[52] U.S. Cl. .......................... 430/259; 430/257; 430/260; 430/262
[58] Field of Search ................................ 430/259, 260, 430/262

[56] References Cited

U.S. PATENT DOCUMENTS

| | | | |
|---|---|---|---|
| 4,766,053 | 8/1988 | Shinozaki et al. | 430/262 |
| 5,300,399 | 4/1994 | Wilczak | 430/253 |
| 5,409,800 | 4/1995 | Sato et al. | 430/259 |

*Primary Examiner*—Hoa Van Le
*Attorney, Agent, or Firm*—Roberts & Mercanti, L.L.P.

[57] ABSTRACT

A negative-acting color proofing element comprising, sequentially, (i) a strippable, transparent cover sheet; (ii) a crosslinked layer, which comprises a polymer having phenolic groups; (iii) a color layer, which comprises an organic binder, a polymerizable monomer, a colorant, and an optional photoinitiator, (iv) a photoadhering layer, which comprises a polymerizable component having at least one ethylenically unsaturated group; a polymer comprising polyvinyl acetal and polyvinyl alcohol segments, having from about 1 to about 40 weight % polyvinyl alcohol content; and an optional photoinitiator, wherein least one of either the color layer or the photoadhering layer contains a photoinitiator; (v) a thermoplastic adhesive layer; and (vii) a receiver sheet. Preferably the polymerizable component and photoinitiator diffuse into the color layer during assembly of the element. An image is produced by laminating the photosensitive element to a receiver sheet; imagewise exposing the color layer and the photoadhering layer to actinic radiation through the transparent cover and crosslinked phenolic layer; peeling apart the receiver sheet and the transparent cover sheet, leaving exposed areas of the color layer attached to the receiver sheet via the photoadhering layer and adhesive layer and unexposed areas being removed with the cover sheet and the crosslinked phenolic layer, thereby forming a colored negative image on the receiver sheet. Preferably these image producing steps are repeated at least once wherein another photosensitive element having a different colorant is transferred via its photoadhering and adhesive layers to the negative image previously produced on the receiver sheet.

26 Claims, No Drawings

NEGATIVE WORKING, PEEL DEVELOPABLE, SINGLE SHEET COLOR PROOFING SYSTEM WITH POLYVINYL ACETAL PHOTOADHERING LAYER

BACKGROUND OF THE INVENTION

1. Field of the Invention

The invention relates to color proofing films. More particularly, the invention pertains to a negative working, peel-apart photosensitive element capable of producing negative images upon imagewise exposure to actinic radiation and subsequent peel-apart development. Such color proofing films produce multicolored negative images on a single receiver sheet by successive imagewise exposures to actinic radiation and peel developments.

2. Description of the Prior Art

In the field of lithographic printing, it is desirable to produce a multicolor proof to assist in correcting a set of color separation films prior to using them to produce metal based lithographic printing plates. The proof should reproduce the color quality that will ultimately be obtained during the printing process. The proof must be a consistent duplicate of the desired halftone image. Visual examination of a color proof should show the color rendition to be expected from a press printing using the color separations, and any defects on the separations which might need to be altered before making the printing plates.

It is known to produce color proofs for multicolor printing by using a printing press or proof press. However, this procedure requires that all of the actual printing steps be performed including making expensive metal printing plates. As a result, this conventional method of color proofing is costly and time consuming. Photoimaging processes can also be used to produce a color proof. There are two general types of photoimaging methods, namely the overlay type and the single sheet type.

In the overlay type of color proofing method, an independent transparent plastic support is used for producing an image of each color separation film by applying a photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This can be accomplished by sequentially applying colorants or colored, photosensitive layers to a single opaque support. This method more closely resembles the actual printing process and eliminates the color distortion inherent in the overlay system. Examples of such single sheet approaches are contained in U.S. Pat. Nos. 3,574,049; 3,671,236; 4,260,673; 4,366,223; 4,650,738; 4,656,114; and 4,659,642.

Various processes for producing single sheet color proofs of an image embodying thermal transfer and photopolymerization techniques are known, for example, from U.S. Pat. Nos. 3,060,023; 3,060,024; 3,060,025; 3,481,736; and 3,607,264.

Peel apart color proofing systems are also well known. U.S. Pat. Nos. 4,963,462; 5,049,476; 4,910,120 and 5,108,868, which are incorporated herein by reference, disclose peel developable, single sheet color proofing systems. U.S. Pat. No. 4,489,154, discloses a process which produces a single layer color proof by peel development. The photosensitive material comprises a strippable cover sheet; a colored photoadherent layer; a nonphotosensitive organic contiguous layer; and a sheet support. The material is exposed and peel developed. The positive or negative image is transferred to a receiver base. A fresh layer of adhesive must be applied to the receptor for each subsequent transfer. U.S. Pat. No. 5,300,399, which is incorporated herein by reference, discloses a peel apart color proofing system to produce a negative-acting color proofing film. This element sequentially comprises a strippable cover sheet which is transparent to actinic radiation; a crosslinked release layer; a color layer; a photoadhering layer; a thermoplastic adhesive layer; and a receiver sheet. At least one of the color layer and the photoadhering layer contains a photoinitiator. A single sheet, negative working color proofing film having good image quality with high resolution is produced when exposed through the strippable cover sheet. This element suffers from poor storage stability. That is, the functional photospeed of the element degrades over time, especially at elevated temperatures and relative humidities. It has been unexpectedly found that the inclusion of a polymer comprising polyvinyl acetal and polyvinyl alcohol segments in the photoadhering layer provides an article which produces consistent, high resolution negative images by a peel development process and improves storage stability of the element so that unwanted loss of photospeed can be avoided.

SUMMARY OF THE INVENTION

The invention provides a photosensitive element which comprises, in order from top to bottom:

(i) a strippable, transparent cover sheet;

(ii) a crosslinked layer, which comprises a polymer having phenolic groups;

(iii) a color layer, which comprises an organic binder, a polymerizable component comprising an ethylenically unsaturated monomer, polymer or oligomer having at least one unsaturated group, a colorant, and optionally, a photoinitiator, wherein the binder is present in sufficient amount to bind the color layer components into a uniform film, wherein the optional photoinitiator, when present, is present in sufficient amount to initiate polymerization of the polymerizable component, wherein the polymerizable component is present in sufficient amount to provide image differentiation when the element is imagewise exposed to actinic radiation and wherein the colorant is present in an amount sufficient to uniformly color the color layer;

(iv) a photoadhering layer, which comprises a polymerizable component comprising an ethylenically unsaturated monomer, polymer or oligomer having at least one unsaturated group; a polymer comprising polyvinyl acetal and polyvinyl alcohol segments, having from about 1 to about 40 weight % polyvinyl alcohol content; and an optional photoinitiator, wherein the optional photoinitiator, when present, is present in sufficient amount to initiate polymerization of the polymerizable component; and wherein at least one of the color layer and the photoadhering layer contains a photoinitiator; and (v) a thermoplastic adhesive layer.

The invention also provides a method for producing a negative image which comprises:

A) providing a photosensitive element which comprises, in order from top to bottom:

(i) a strippable, transparent cover sheet;

(ii) a crosslinked layer, which comprises a polymer having phenolic groups;

(iii) a color layer, which comprises an organic binder, a polymerizable component comprising an ethylenically unsaturated monomer, polymer or oligomer having at least one unsaturated group, a colorant, and optionally, a photoinitiator, wherein the binder is present in sufficient amount to bind the color layer components into a uniform film, wherein the optional photoinitiator, when present, is present in sufficient amount to initiate polymerization of the polymerizable component, wherein the polymerizable component is present in sufficient amount to provide image differentiation when the element is imagewise exposed to actinic radiation and wherein the colorant is present in an amount sufficient to uniformly color the color layer;

(iv) a photoadhering layer, which comprises a polymerizable component comprising an ethylenically unsaturated monomer, polymer or oligomer having at least one unsaturated group; a polymer comprising polyvinyl acetal and polyvinyl alcohol segments, having from about 1 to about 40 weight % polyvinyl alcohol content; and an optional photoinitiator, wherein the optional photoinitiator, when present, is present in sufficient amount to initiate polymerization of the polymerizable component; and wherein at least one of either the color layer or the photoadhering layer contains a photoinitiator;

(v) a thermoplastic adhesive layer;

(B) laminating the photosensitive element to a receiver sheet;

(C) imagewise exposing the color layer and the photoadhering layer to actinic radiation through the transparent cover and crosslinked phenolic layer;

(D) peeling apart the receiver sheet and the transparent cover sheet, leaving exposed areas of the color layer attached to the receiver sheet via the photoadhering layer and adhesive layer and unexposed areas being removed with the cover sheet and the crosslinked phenolic layer, thereby forming a colored negative image on the receiver sheet; and (E) optionally repeating steps A) through D) at least once wherein another photosensitive element having at least one different colorant, is transferred via its photoadhering and adhesive layers to the negative image previously produced on the receiver sheet.

The invention further provides a method for producing a photosensitive element which comprises:

(i) applying a crosslinked layer which comprises a polymer having phenolic groups, to a surface of a strippable, transparent cover sheet;

(ii) applying a color layer onto the crosslinked layer, which color layer comprises an organic binder and a colorant, wherein the binder is present in sufficient amount to bind the color layer components into a uniform film and wherein the colorant is present in an amount sufficient to uniformly color the color layer;

(iii) applying a photoadhering layer onto the color layer, which photoadhering layer comprises a polymerizable component comprising an ethylenically unsaturated monomer, polymer or oligomer having at least one unsaturated group; a polymer comprising polyvinyl acetal and polyvinyl alcohol segments and having from about 1 to about 40 weight % polyvinyl alcohol content; and a photoinitiator, wherein the photoinitiator is present in sufficient amount to initiate polymerization of the polymerizable component; and causing the polymerizable component and photoinitiator to diffuse into the color layer; and (iv) applying a thermoplastic adhesive layer onto the photoadhering layer.

DETAILED DESCRIPTION OF THE PREFERRED EMBODIMENT

One prepares a photosensitive element according to the invention by forming layers on a transparent cover sheet which are sequentially a crosslinked phenolic layer, a color layer, a photoadherent layer and a thermoplastic adhesive layer.

In the preferred embodiment, the cover sheet may be composed of any suitable flexible sheet material provided it is transparent to the actinic radiation to which the color layer and photoadhering layer are sensitive. In the preferred embodiment, the cover sheet has a surface which is dimensionally stable when undergoing the herein specified treatment process. That is, it should have substantially no change in dimensions under heating in the range of approximately 60° C. to 120° C. during lamination. One preferred material is polyethylene terephthalate. In the preferred embodiment, it has a thickness of from about 1 to about 10 mils, a more preferred thickness is from about 2 to about 5 mils and most preferably from about 2 to about 3 mils. Suitable films nonexclusively include Melinex 054, 504, 505, and 582 films available from ICI, and Hostaphan 4400, 4500, and 4540 films available from Hoechst Celanese Corporation. The surface of the support may be smooth or it may be provided with a matte texture as with Melinex 475 film. A smooth surface is preferred because a rough surface scatters actinic radiation and thereby reduces the resolution capability of the photosensitive element.

On the cover sheet is a crosslinked layer, which comprises a polymer having phenolic groups. The phenolic polymer can comprise, for example, a novolak (cresol-formaldehyde resin), polyhydroxystyrene homo- and co-polymer, or acrylic polymer containing phenolic groups etc. Crosslinking of the polymer can be achieved, for example, by the use of polyisocyanates, melamine-formaldehyde resins, urea-formaldehyde resins, epoxy resins, aziridine resins, acrylic monomers under suitable conditions of heat and/or light, etc. The crosslinked phenolic layer is applied from a solvent coating composition onto the cover sheet and should be insoluble in solvents used to coat the subsequent layer. Useful solvents include organic solvents as well as water.

A color layer is then applied to the crosslinked phenolic layer. It comprises a colorant, a binder, a photoinitiator and a polymerizable component which may be an ethylenically unsaturated monomer, polymer or oligomer having at least one and preferably more than one unsaturated groups. The color layer may be formed from a composition containing all of these components, or more preferably, the color layer is formed by coating an admixture of a binder and colorant onto the phenolic layer and the photoinitiator and polymerizable component diffuse into the color layer from a subsequently applied photoadherent layer.

The polymerizable component in the color layer and in the photoadhering layer preferably comprise addition polymerizable, non-gaseous (boiling temperature above 100° C. at normal atmospheric pressure), ethylenically-unsaturated compounds containing at least one and preferably at least two terminal ethylenically unsaturated groups, and being capable of forming a high molecular weight polymer by free radical initiated, chain propagating addition polymerization. The most preferred compounds are acrylate or methacrylate monomers as are well known in the art. Suitable polymerizable monomers nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, and bisphenol A diepoxide dimethacrylate. The monomers in the color and photoadhering layers can be the same or different.

Free radical liberating photoinitiators used in the color layer and/or photoadhering layer include any compound which liberate free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon substituted aromatic acyloins in U.S. Pat. No. 2,722,512; polynuclear quinones in U.S. Pat. Nos. 2,951,758 and 3,046,127; and s-triazines in U.S. Pat. Nos. 3,987,037 and 4,189,323. The most preferred photoinitiators include 2,3-di(4-methoxyphenyl)quinoxaline, 9-phenylacridine, 2-biphenyl-4,6-bis-trichloromethyl-5-triazine, bis(2,4,5-triphenyl)imidazole, bis-trichloromethyl-s-triazines, thioxanthones, acetophenones and acyl phosphine oxides, and the derivatives of each of these. For this invention, the term derivatives means that the compound may have pendant groups provided they do not prevent the compound from effecting photoinitiation. The photoinitiator used in the color and/or photoadhering layer may be the same or different.

The color layer also contains a binding resin which not only determines the hardness and/or flexibility of the coating but is also used to control the dry development. Binding resins found suitable for the color layer are polyvinyl acetates, styrene/maleic anhydride copolymers and their half esters; acrylic polymers and copolymers; polyamides; polyvinyl pyrrolidones; cellulose and its derivatives; phenolic resins; and the like. The most preferred binding resins are polyvinyl acetates and acetals, such as UCAR resins available from Union Carbide, and polyvinyl formal, polyvinyl butyral and polyvinyl propional.

The color layer contains a colorant which may be a dye or a pigment to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer. Non-exclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color. Dyes may be included in the color layer to spectrally sensitize the photoinitiator, such as described in U.S. Pat. Nos. 4,282,309 and 4,454,218, and European Patent Applications 0,179,448 and 0,211,615.

In the practice of the present invention, the photoinitiator component is preferably present in the color layer in an amount ranging from approximately 0.01 to 20% based on the weight elf the solids in the layer. A preferred range is from about 0.1 to 15%, more preferably from 1 to 10%. The colorant component is preferably present in an amount sufficient to uniformly color the color layer. It is preferably present in an amount ranging from about 5 to about 50% based on the weight of the solids in the color layer. A more preferred range is from about 8 to about 40%. In a preferred embodiment of the present invention, the binder component is present in the color layer in an amount sufficient to bind the components in a uniform mixture and a uniform film when it is coated on a substrate. It is preferably present in an amount ranging from about 10 to about 90% based on the weight of the solids in the color layer. A more preferred range is from about 20 to about 80%. In the preferred embodiments, the polymerizable component is present in the color layer in an amount of from about 1 to about 60% by weight of the total solids in the color layer, more preferably from about 5% to about 50%.

Other ingredients which may be present in the color layer may include thermal polymerization inhibitors, tackifiers, oligomers, residual solvents, surfactants, inert fillers, antihalation agents, hydrogen atom donors, photoactivators, and optical brightening agents. A plasticizer may also be included in the color or photoadhering layer of this invention to prevent coating brittleness and to keep the composition pliable if desired. Suitable plasticizers include dibutylphthalate, triarylphosphate and substituted analogs thereof and preferably dioctylphthalate. The color layer is applied from a solvent coating composition to the crosslinked phenolic layer and dried. Organic solvents are preferred for the color layer because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, diacetone alcohol, and gamma-butyrolactone. In the preferred embodiment the dry color layer has a coating weight range of from about 0.1 to about 5 g/m$^2$, preferably from about 0.2 to about 2 g/m$^2$ and the crosslinked phenolic layer has a coating weight range of from about 0.1 to about 5 g/m$^2$, preferably from about 0.4 to 2.0 g/m$^2$.

Adhered to the color layer is the photoadhering layer. The photoadhering layer comprises a photoinitiator, a polymerizable component comprising an ethylenically unsaturated monomer, polymer or oligomer having at least one unsaturated group; and a polymer comprising polyvinyl acetal and polyvinyl alcohol segments, having from about 1 to about 40 weight % polyvinyl alcohol content.

The photoinitiator may comprise any of the photoinitiators described above as useful for the color layer. In the practice of the present invention, the photoinitiator component is preferably present in the photoadhering layer in an amount ranging from about 1 to about 20% based on the weight of the solids in the layer. A preferred range is from about 2 to about 15%, more preferably from about 3 to about 10%. The polymerizable component comprising an ethylenically unsaturated monomer, polymer or oligomer having at least one unsaturated group may comprise the same materials listed above as useful for the color layer. The polymerizable component is preferably present in the photoadhering layer in an amount ranging from about 5 to about 50% based on the weight of the solids in the layer. A preferred range is from about 10% to about 45%, more preferably from about 15 to about 40%.

Preferably the polyvinyl acetal has from about 3 to about 30 weight % polyvinyl alcohol content and more preferably from about 5 to about 25 weight % polyvinyl alcohol content. Suitable polymers comprising polyvinyl acetal and polyvinyl alcohol segments, having from about 1 to about 40 weight % polyvinyl alcohol content non-exclusively include polyvinyl butyrals and propional such as Butvars 79, 76, 90, 98 72, 73 and 74 from Monsanto, Mowitals B30HH, B60HH available from Hoechst AG and the resins described in U.S. Pat. No. 4,665,124, which is incorporated herein by reference. The polyvinyl acetal component is preferably present in the photoadhering layer in an amount of from about 5 to about 85%, more preferably from about 20% to about 70% and most preferably from about 30% to about 65% by weight of the total solids in the photoadhering layer.

The photoadherent layer preferably also comprises a photopolymerizable polymer. Suitable photopolymerizable polymers nonexclusively include a urethane adduct of polyvinyl butyral or other acetal resins containing hydroxy groups and isocyanatoethyl methacrylate, or reaction product of hydroxy-containing acetal resins with methacrylic anhydride, acrylic acid, acryloyl chloride, etc. Such a polymer has ethylenically unsaturated, photocrosslinkable groups and a molecular weight greater than about 3,000 and preferably from about 50,000 to about 200,000. Preferred photopolymerizable polymers comprise random units of

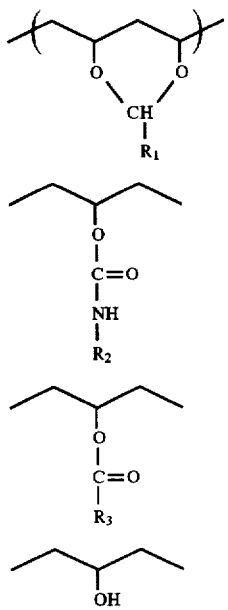

wherein
a=50–99%
b=1=30%
c=0–30%
d=0–50% and a+b+c+d=100%

$R_1$ is a hydrogen atom or a substituted or unsubstituted alkyl radical having from 1 to about 6 carbon atoms, or a substituted or unsubstituted aryl radical;

$R_2$ is

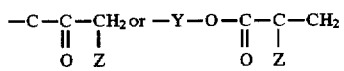

wherein Z is hydrogen or methyl and Y is a substituted or unsubstituted alkyl group having 1 to about 4 carbon atoms; and $R_3$ is an alkyl radical having from 1 to about 4 carbon atoms. As used herein the term "substituted" means having a pendant group which does not detrimentally affect the photosensitive property of the polymer.

A preferred photopolymerizable polymer is the reaction product of a polyvinyl acetal such as a polyvinyl butyral with a (meth)acrylated monoisocyanate such as acryloyl isocyanate, methacryloyl isocyanate or isocyanatoethyl methacrylate. Such a reaction may take place in an organic solvent unreactive with the isocyanate, such as tetrahydrofurane, methyl ethyl ketone or ethyl acetate. The reaction may optionally be catalyzed by such known catalysts as dibutyltin dilaureate. Acrylic polymers containing hydroxy groups can also be used with all the above (meth) acrylic groups-containing reagents, as can polyvinyl alcohols and their copolymers, phenolic resins, etc. Other reactive groups on polymers which can be (meth)acrylated nonexclusively include: amino, carboxyl, epoxy, etc. The (meth)acrylated polyvinyl acetal polymers are preferred. The photopolymerizable polymer component is preferably present in the photoadhering layer in an amount of from about 3 to about 50%, more preferably from about 5% to about 40% and most preferably from about 10% to about 30% by weight of the total solids in the photoadhering layer.

The photoadherent layer may optionally contain such other desired components as uv absorbers such as Uvinul D-50 available from GAF, antistatic compositions such as Gafac and Gafstat available from GAF, optical brighteners, inert fillers, thermal polymerizable inhibitors, residual solvents, surfactants, antihalation agents, hydrogen atom donors, tackifiers, and plasticizers such as Resoflex R-296, available from Cambridge Industries.

To form the photoadhering layer, the components may be dissolved in a solvent or mixture of solvents to facilitate application of the composition to the substrate. Suitable solvents for this purpose nonexclusively include water, tetrahydrofuran, n-butyl acetate, isobutyl isobutyrate, glycol ethers such as propylene glycol monomethyl ether and methyl cellosolve, alcohols such as ethanol and n-propanol and ketones such as methyl ethyl ketone. In general, the solvent composition is evaporated from the coating composition once it is applied to an appropriate substrate. However, some insignificant amount of solvent may remain as residue. In addition, the monomer from the photoadhering layer tends to diffuse into the color layer during overcoating process, so one way of providing the color layer with the monomer is not to include it in the coating solution of the color layer, but let it migrate there from the photoadhering layer during coating and drying process, or during lamination of the layers. This process of monomer migration via diffusion is known to those skilled in the art of creating multilayer imaging systems. According to the present invention, it is important that the monomer be present in the color layer when the element is exposed to actinic radiation.

regardless of the way it became the part of the color layer. In the preferred embodiment, the photoadhering layer has a coating weight between approximately 2 and 20 g/m². The most preferred weight is from about 3 to 10 g/m².

The element next comprises a thermoplastic adhesive layer coated directly on the photoadhering layer. Preferred adhesive layers comprise thermoplastic resins coatable out of water. Such nonexclusively include Carboset acrylic resins, polyvinyl acetate/crotonic acid copolymers, polyvinyl pyrrolidone/polyvinyl acetate copolymers, polyvinyl acetate emulsions, styrene/maleic anhydride copolymers, urethane polymers, etc. The adhesive layer should be coated from a solvent which does not disturb the photoadhering layer underneath. Water is the preferred solvent. The adhesive layer may comprise a plasticizer may be present in an amount of up to about 10% by weight and a uv absorber up to about 10% by weight. The coating weight of the layer should be from about 2 to about 20g/m², more preferably from about 5 to about 15 g/m², and most preferably from about 6 to about 10 g/m². In place of direct overcoating, one can assemble the hereinbefore described photosensitive element by hot-laminating the layers to each other, as is well known in the art. The adhesive layer should be transferable to a receiver sheet when laminated with pressure and heat in a temperature range of from about 50° C. to about 180° C., preferably 60° C. to 120° C., more preferably 60° C. to 100° C.

Receiver sheets may comprise virtually any material which can withstand the laminating and dry development processes. White plastic sheets, such as adhesion pretreated polyester Melinex 3020 film available from ICI, are useful for this purpose. Plastic coated paper sheets, such as polyethylene coated paper available from Schoeller, may also be used. Other bases may include wood, glass, metal, paper and the like.

Lamination of the photosensitive element to a receiver sheet may be conducted by putting the adhesive layer in contact with the receiver sheet and then introducing the materials into the nip of a pair of heated laminating rollers under suitable pressure. Suitable laminating temperatures usually range from approximately 60° C. to 120° C., preferably from 70° C. to 100° C. The element is then exposed by means well known in the art. Such exposure may be conducted by exposure to actinic radiation from a light source through a conventional halftone negative color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

After exposure, a negative image is anchored via the photoadhering layer and adhesive layer on the receiver sheet by stripping the transparent cover sheet from the receiver sheet at room temperature with a steady, continuous motion. The preferred peel angle relative to the peel direction is greater than 90°. The delamination leaves the photoexposed areas of the color layer attached to the photoadhering layer, which in its entirety is attached to the receiver sheet via the adhesive layer on the receiver sheet. The nonexposed areas of the color layer remain on the phenolic layer on the cover sheet which has been peeled apart from the receiver sheet. Thus, a negative image remains on the receiver sheet.

In a full color proofing guide, four distinct colored images are formed, namely magenta, cyan, yellow, and black. When the images are superimposed upon each other, a simulated full color reproduction results. In order to attain a multicolored image, another photosensitive element comprising, in order, a transparent cover sheet, crosslinked phenolic layer, a color layer, a photoadhering layer and an adhesive layer is laminated onto the first image on the receiver sheet, exposed and the second color is dry developed by peeling apart the receiver sheet from the cover sheet of the additional photosensitive element. The second negative image remains with its photosensitive adhesive layer with the first image. A third and a fourth image may be added in a manner similar to that used to produce the second image. In the usual case, four colored layers are employed to produce a full color reproduction of a desired image. These four colors are cyan, magenta, yellow and black. A matte finish of the final image may be obtained by embossing the shiny, top surface of the image with a matte material, such as Melinex 377 film available from ICI. This is done by laminating together the final image and matte material and peeling the matte material away. The final four color proof may be given a uniform, blanket exposure to photoharden the exposed, colored areas on the receiver base. A protective layer may also be laminated on top of the last dry developed layer.

The following nonlimiting examples serve to illustrate the invention.

EXAMPLE 1 (COMPARATIVE)

This comparative example is produced according to U.S. Pat. No. 5,300,399. A negative-working multilayer element was prepared as follows:

On a 2 mil sheet of PET the following solution was coated with the aid of #12 Meyer rod:

1. Methyl ethyl ketone—47 g
2. Methoxy propanol—47 g
3. Poly-p-hydroxy styrene (12,000 MW, Maruzen)—10 g
4. Melamine-formaldehyde resin (Cymel 303, Cytec)—2 g
5. p-Toluenesulfonic acid—1 g.

The layer was crosslinked in the oven at 100° C. for 2 minutes. The dry weight was 1 g/m². On this crosslinked layer, a color solution (magenta) was coated with the aid of #8 Meyer rod:

1. Methoxy propanol—53 g
2. Methyl ethyl ketone—13 g
3. Diacetone alcohol—20 g
4. Magenta pigment dispersion (in weight%: gamma-butyrolactone—80.2, Formvar 12/85 polyvinyl formal resin, Monsanto—9.0, Permanent Carmine FBB pigment, Hoechst—10.8)—13.2g.

The color layer was dried in the oven at 100° C. for 1 minute. On this color layer, a photoadhering layer solution was coated with the aid of #24 Meyer rod:

1. n-Butyl acetate—50 g
2. Polymer containing methacrylate groups (U.S. Pat. No. 5,300,399, Example 1)—10 g
3. Dipentaerythritol pentaacrylate (Sartomer 399, Sartomer Co)—4 g
4. 2-biphenylyl-4,6-bis-trichloromethyl-s-triazine—0.6 g The layer had 4 g/m² dry thickness. On this photoadhering layer, an adhesive solution was coated with the aid of #20 Meyer rod:

1. Water—44 g
2. Acrylic resin (Carboset 511, BF Goodrich)—28 g
3. Polyurethane resin (Sancure 2104, BF Goodrich)—25 g.

The adhesive layer was dried and had 6 g/m² dry thickness.

For imagewise exposure, one half of the above element was laminated, using heat and pressure to Pressmatch Publication Base, available from Agfa. A 30 second exposure to actinic light through a Stouffer stepwedge (0.15 incremental density increase per step) and peel development revealed a negative image on the base with a Stouffer solid step five.

The other half of the above multilayer element was stored for 7 days at 38 degrees C. and 85% relative humidity, and then laminated, exposed, and peel-developed as above. Only Stouffer solid step 2 was obtained, indicating a loss of photospeed of 3 steps over that period. The embodiment of the invention as described in the U.S. Pat. No. 5,300,399 has a shortcoming which manifests itself in poor storage stability. That means that the functional photospeed of the element is not constant in time, particularly at elevated temperatures. Thus, the element described in '399 loses 3 Stouffer steps of functional photospeed when stored for 7 days at 38 degrees Celsius at 85% relative humidity.

EXAMPLE 1

This example will demonstrate how incorporation of a polyvinyl butyral resin in the photoadhering layer prevents the unwanted loss of photospeed.

Comparative Example 1 was repeated, only this time 25% of the polymer containing methacrylate groups were replaced with a polyvinyl butyral polymer (Butvar B79, Monsanto) in the photoadhering solution. The material lost 2 steps of photospeed over 7 days at 38° C. and 85%RH.

Comparative Example 1 was repeated again, only this time 50% of the polymer containing methacrylate groups were replaced with a polyvinyl butyral polymer (Butvar B79, Monsanto) in the photoadhering solution. The material lost 1 step of photospeed over 7 days at 38° C. and 85%RH.

Comparative Example 1 was repeated yet again, only this time 75% of the polymer containing methacrylate groups were replaced with a polyvinyl butyral polymer (Butvar B79, Monsanto) in the photoadhering solution. The material lost 0 steps of photospeed over 7 days at 38° C. and 85%RH—was stable over that period.

EXAMPLE 2

This example will demonstrate how incorporation of a different polyvinyl butyral resin in the photoadhering layer prevents the unwanted loss of photospeed.

Comparative Example 1 was repeated, only this time 25% of the polymer containing methacrylate groups were replaced with a polyvinyl butyral polymer (Mowital B30HH, Hoechst) in the photoadhering solution. The material lost 2 steps of photospeed over 7 days at 38° C. and 85%RH.

Comparative Example 1 was repeated again, only this time 50% of the polymer containing methacrylate groups were replaced with a polyvinyl butyral polymer (Mowital B30HH, Hoechst) in the photoadhering solution. The material lost 1.5 steps of photospeed over 7 days at 38° C. and 85%RH.

Comparative Example 1 was repeated yet again, only this time 75% of the polymer containing methacrylate groups were replaced with a polyvinyl butyral polymer (Mowital B30HH, Hoechst) in the photoadhering solution. The material lost 0.5 steps of photospeed over 7 days at 38° C. and 85%RH—was essentially stable over that period.

EXAMPLE 3

This example will demonstrate how incorporation of a polyvinyl propional resin in the photoadhering layer prevents the unwanted loss of photospeed.

Comparative Example 1 was repeated, only this time 25% of the Polymer containing methacrylate groups were replaced with a polyvinyl propional polymer (prepared according to U.S. Pat. No. 4,670,507) in the photoadhering solution. The material lost 2 steps of photospeed over 7 days at 38° C. and 85%RH.

Comparative Example 1 was repeated again, only this time 50% of the polymer containing methacrylate groups were replaced with a polyvinyl propional polymer (prepared according to U.S. Pat. No. 4,670,507) in the photoadhering solution. The material lost 1.5 steps of photospeed over 7 days at 38° C. and 85%RH.

Comparative Example 1 was repeated yet again, only this time 75% of the polymer containing methacrylate groups were replaced with a polyvinyl propional polymer (prepared according to U.S. Pat. No. 4,670,507) in the photoadhering solution. The material lost 0.5 steps of photospeed over 7 days at 38° C. and 85% RH was essentially stable over that period.

What is claimed is:

1. A photosensitive element which comprises, in order from top to bottom:

(i) a strippable, transparent cover sheet;
   (ii) a crosslinked layer, which comprises a polymer having phenolic groups;
   (iii) a color layer, which comprises an organic binder, a polymerizable component comprising an ethylenically unsaturated monomer, polymer or oligomer having at least one unsaturated group, a colorant, and optionally, a photoinitiator, wherein the binder is present in sufficient amount to bind the color layer components into a uniform film, wherein the optional photoinitiator, when present, is present in sufficient amount to initiate polymerization of the polymerizable component, wherein the polymerizable component is present in sufficient amount to provide image differentiation when the element is imagewise exposed to actinic radiation and wherein the colorant is present in an amount sufficient to uniformly color the color layer;
   (iv) a photoadhering layer, which comprises a polymerizable component comprising an ethylenically unsaturated monomer, polymer or oligomer having at least one unsaturated group; a polymer comprising polyvinyl acetal and polyvinyl alcohol segments, having from about 1 to about 40 weight % polyvinyl alcohol content; and an optional photoinitiator, wherein the optional photoinitiator, when present, is present in sufficient amount to initiate polymerization of the polymerizable component; and wherein at least one of the color layer and the photoadhering layer contains a photoinitiator; and
   (v) a thermoplastic adhesive layer.

2. The photosensitive element of claim 1 wherein the polymer comprising polyvinyl acetal and polyvinyl alcohol segments is a polyvinyl butyral polymer.

3. The photosensitive element of claim 1 wherein the photoadhering layer further comprises a photopolymerizable polymer having ethylenically unsaturated, photocrosslinkable groups and a molecular weight greater than 3,000.

4. The photosensitive element of claim 3 wherein the polymer having ethylenically unsaturated, photocrosslinkable groups and a molecular weight greater than 3,000 is present in the photoadhering layer in an amount of from about 10 to about 30 weight percent based on the weight of the non-solvent parts of the photoadherent layer.

5. The photosensitive element of claim 1 wherein the polymer comprising polyvinyl acetal and polyvinyl alcohol segments has from about 3 to about 30 weight % polyvinyl alcohol content.

6. The photosensitive element of claim 1 wherein the polymer comprising polyvinyl acetal and polyvinyl alcohol segments has from about 5 to about 25 weight % polyvinyl alcohol content.

7. The photosensitive element of claim 1 wherein both the color layer and the photoadhering layer contain a photoinitiator.

8. The photosensitive element of claim 7, wherein the ethylenically unsaturated polymerizable component is delivered to the color layer by interlayer diffusion during assembly of the photosensitive element.

9. The photosensitive element of claim 1 wherein the polymerizable component comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, di-pentaerythritol pentaacrylate, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, diacrylate bisphenol A diepoxide dimethacrylate and bisphenol A.

10. The photosensitive element of claim 1 wherein the photoinitiator comprises one or more photoinitiators selected from the group consisting of 2,3-di(4-methoxyphenyl)quinoxaline, 9-phenylacridine, 2-biphenyl-4,6-bis-trichloromethyl-5-triazine, bis(2,4,5-triphenyl) imidazole, bis-trichloromethyl-s-triazine, acetophenones, thioxanthones, acyl phosphine oxides, and their derivatives.

11. The photosensitive element of claim 1 wherein the color layer comprises one or more binding resins selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers.

12. The photosensitive element of claim 1 wherein the at least one of the color layer and the photoadhering layer further comprises one or more ingredients selected from the group consisting of plasticizers, tackifiers, stabilizers, antistatic compositions, uv absorbers, spectral sensitizers, optical brighteners, inert fillers, exposure indicators, polymerization inhibitors, surfactants, hydrogen atom donors, antihalation agents, and photoactivators.

13. The photosensitive element of claim 1 wherein the receiver sheet comprises paper, coated paper, or a polymeric film.

14. A method for producing a photosensitive element which comprises:
 (i) applying a crosslinked layer which comprises a polymer having phenolic groups, to a surface of a strippable, transparent cover sheet;
 (ii) applying a color layer onto the crosslinked layer, which color layer comprises an organic binder and a colorant, wherein the binder is present in sufficient amount sufficient to bind the color layer components into a uniform film and wherein the colorant is present in an amount sufficient to uniformly color the color layer;
 (iii) applying a photoadhering layer onto the color layer, which photoadhering layer comprises a polymerizable component comprising an ethylenically unsaturated monomer, polymer or oligomer having at least one unsaturated group; a polymer comprising polyvinyl acetal and polyvinyl alcohol segments and having from about 1 to about 40 weight % polyvinyl alcohol content; and a photoinitiator, wherein the photoinitiator is present in sufficient amount to initiate polymerization of the polymerizable component; and causing the polymerizable component and photoinitiator to diffuse into the color layer; and
 (iv) applying a thermoplastic adhesive layer onto the photoadhering layer.

15. A method for producing a negative image which comprises:
 A) providing a photosensitive element which comprises, in order from top to bottom:
  (i) a strippable, transparent cover sheet;
  (ii) a crosslinked layer, which comprises a polymer having phenolic groups;
  (iii) a color layer, which comprises an organic binder, a polymerizable component comprising an ethylenically unsaturated monomer, polymer or oligomer having at least one unsaturated group, a colorant, and optionally, a photoinitiator, wherein the binder is present in sufficient amount to bind the color layer components into a uniform film, wherein the optional photoinitiator, when present, is present in sufficient amount to initiate polymerization of the polymerizable component, wherein the polymerizable component is present in sufficient amount to provide image differentiation when the element is imagewise exposed to actinic radiation and wherein the colorant is present in an amount sufficient to uniformly color the color layer;
  (iv) a photoadhering layer, which comprises a polymerizable component comprising an ethylenically unsaturated monomer, polymer or oligomer having at least one unsaturated group; a polymer comprising polyvinyl acetal and polyvinyl alcohol segments, having from about 1 to about 40 weight % polyvinyl alcohol content; and an optional photoinitiator, wherein the optional photoinitiator, when present, is present in sufficient amount to initiate polymerization of the polymerizable component; and wherein at least one of either the color layer or the photoadhering layer contains a photoinitiator;
  (v) a thermoplastic adhesive layer;
 (B) laminating the photosensitive element to a receiver sheet;
 (C) imagewise exposing the color layer and the photoadhering layer to actinic radiation through the transparent cover and crosslinked phenolic layer;
 (D) peeling apart the receiver sheet and the transparent cover sheet, leaving exposed areas of the color layer attached to the receiver sheet via the photoadhering layer and adhesive layer and unexposed areas being removed with the cover sheet and the crosslinked phenolic layer, thereby forming a colored negative image on the receiver sheet; and
 (E) optionally repeating steps A) through D) at least once wherein another photosensitive element having at least one different colorant, is transferred via its photoadhering and adhesive layers to the negative image previously produced on the receiver sheet.

16. The method of claim 15 wherein the polymer comprising polyvinyl acetal and polyvinyl alcohol segments is a polyvinyl butyral polymer.

17. The method of claim 15 wherein the photoadhering layer further comprises a photopolymerizable polymer having ethylenically unsaturated, photocrosslinkable groups and a molecular weight greater than 3,000.

18. The method of claim 17 wherein the polymer having ethylenically unsaturated, photocrosslinkable groups and a molecular weight greater than 3,000 is present in the photoadhering layer in an amount of from about 10 to about 30 weight percent based on the weight of the non-solvent parts of the photoadherent layer.

19. The method of claim 15 wherein the polymer comprising polyvinyl acetal and polyvinyl alcohol segments has from about 3 to about 30 weight % polyvinyl alcohol content.

20. The method of claim 15 wherein the polymer comprising polyvinyl acetal and polyvinyl alcohol segments has from about 5 to about 25 weight % polyvinyl alcohol content.

21. The method of claim 15 wherein both the color layer and the photoadhering layer contain a photoinitiator.

22. The method of claim 21, wherein the ethylenically unsaturated polymerizable component is delivered to the color layer by interlayer diffusion during assembly of the photosensitive element.

23. The method of claim 15 wherein the polymerizable component comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, di-pentaerythritol pentaacrylate, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, bisphenol A diepoxide dimethacrylate and bisphenol A diepoxide diacrylate.

24. The method of claim 15 wherein the photoinitiator comprises one or more photoinitiators selected from the group consisting of 2,3-di(4-methoxyphenyl)quinoxaline, 9-phenylacridine, 2-biphenyl-4,6-bis-trichloromethyl-5-triazine, bis(2,4,5-triphenyl)imidazole, bis-trichloromethyl-s-triazine, acetophenones, thioxanthones, acyl phosphine oxides, and their derivatives.

25. The method of claim 15 wherein the color layer comprises one or more binding resins selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers.

26. The method of claim 15 wherein at least one of the color layer and the photoadhering layer further comprises one or more ingredients selected from the group consisting of plasticizers, tackifiers, stabilizers, antistatic compositions, uv absorbers, spectral sensitizers, optical brighteners, inert fillers, exposure indicators, polymerization inhibitors, surfactants, hydrogen atom donors, antihalation agents, and photoactivators.

* * * * *